United States Patent
Rahimo et al.

(10) Patent No.: US 9,601,399 B2
(45) Date of Patent: Mar. 21, 2017

(54) MODULE ARRANGEMENT FOR POWER SEMICONDUCTOR DEVICES

(71) Applicant: ABB Schweiz AG, Baden (CH)

(72) Inventors: Munaf Rahimo, Uezwill (CH); Hamit Duran, Turgi (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/927,006

(22) Filed: Oct. 29, 2015

(65) Prior Publication Data
US 2016/0049342 A1 Feb. 18, 2016

Related U.S. Application Data

(63) Continuation of application No. PCT/EP2014/051815, filed on Jan. 30, 2014.

(30) Foreign Application Priority Data

Apr. 29, 2013 (EP) ..................... 13165785

(51) Int. Cl.
*H01L 23/053* (2006.01)
*H01L 23/049* (2006.01)
(Continued)

(52) U.S. Cl.
CPC .......... *H01L 23/053* (2013.01); *H01L 23/049* (2013.01); *H01L 23/10* (2013.01);
(Continued)

(58) Field of Classification Search
CPC ... H01L 23/053; H01L 23/3107; H01L 24/46; H01L 23/26; H01L 23/20;
(Continued)

(56) References Cited

U.S. PATENT DOCUMENTS 5,536,972 A * 7/1996 Kato .................... H01L 23/3121
257/706
6,650,559 B1 * 11/2003 Okamoto ............ H01L 23/3672
257/E23.103
(Continued)

FOREIGN PATENT DOCUMENTS

DE 102010041714 A1 8/2011
EP 1544915 A2 6/2005
(Continued)

OTHER PUBLICATIONS

European Search Report Application No. EP 13 16 5785 Completed: Sep. 27, 2013; Mailing Date: Oct. 7, 2013 5 pages.
International Preliminary Report on Patentability Application No. PCT/EP2014/051815 Issued: May 21, 2015 6 pages.

*Primary Examiner* — Jarrett Stark
(74) *Attorney, Agent, or Firm* — Whitmyer IP Group LLC

(57) ABSTRACT

A module arrangement for power semiconductor devices, including one or more power semiconductor modules, wherein the one or more power semiconductor modules include a substrate with a first surface and a second surface being arranged opposite to the first surface, wherein the substrate is at least partially electrically insulating, wherein a conductive structure is arranged at the first surface of the substrate, wherein at least one power semiconductor device is arranged on the conductive structure and electrically connected thereto, wherein the one or more modules includes an inner volume for receiving the at least one power semiconductor device which volume is hermetically sealed from its surrounding by a module enclosure, wherein the module arrangement includes an arrangement enclosure at least partly defining a volume for receiving the one or more modules, and wherein the arrangement enclosure seals covers the volume.

17 Claims, 2 Drawing Sheets

(51) Int. Cl.
*H01L 23/10* (2006.01)
*H01L 23/24* (2006.01)
*H01L 25/07* (2006.01)
*H01L 25/11* (2006.01)
*H01L 23/20* (2006.01)
*H01L 23/26* (2006.01)
*H01L 23/31* (2006.01)
*H01L 23/00* (2006.01)

(52) U.S. Cl.
CPC .............. *H01L 23/20* (2013.01); *H01L 23/24* (2013.01); *H01L 23/26* (2013.01); *H01L 23/3107* (2013.01); *H01L 24/46* (2013.01); *H01L 25/072* (2013.01); *H01L 25/115* (2013.01); *H01L 23/315* (2013.01); *H01L 23/3135* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/291* (2013.01); *H01L 2224/32225* (2013.01); *H01L 2224/45124* (2013.01); *H01L 2224/48139* (2013.01); *H01L 2224/48227* (2013.01); *H01L 2224/73265* (2013.01); *H01L 2924/1305* (2013.01); *H01L 2924/13055* (2013.01); *H01L 2924/13091* (2013.01); *H01L 2924/167* (2013.01); *H01L 2924/16251* (2013.01)

(58) Field of Classification Search
CPC ....... H01L 23/10; H01L 23/24; H01L 25/115; H01L 25/072; H01L 23/049
See application file for complete search history.

(56) References Cited

U.S. PATENT DOCUMENTS

| | | | |
|---|---|---|---|
| 2002/0113302 A1* | 8/2002 | Shinohara | H01L 23/4334 257/678 |
| 2005/0040530 A1* | 2/2005 | Shi | H01L 23/057 257/750 |
| 2005/0051789 A1* | 3/2005 | Negley | H01L 33/486 257/99 |
| 2005/0167789 A1* | 8/2005 | Zhuang | H01L 23/047 257/659 |
| 2006/0097385 A1* | 5/2006 | Negley | H01L 33/486 257/722 |
| 2006/0124953 A1* | 6/2006 | Negley | H01L 33/486 257/99 |
| 2007/0246812 A1* | 10/2007 | Zhuang | H01L 25/115 257/678 |
| 2008/0206590 A1* | 8/2008 | Ikeda | B23K 20/02 428/650 |
| 2009/0021916 A1 | 1/2009 | Stolze | |
| 2009/0140414 A1* | 6/2009 | Soyano | H01L 25/072 257/698 |
| 2010/0127371 A1* | 5/2010 | Tschirbs | H01L 23/13 257/684 |
| 2010/0128441 A1* | 5/2010 | Soda | H01L 25/115 361/709 |
| 2012/0098119 A1 | 4/2012 | Refai-Ahmed et al. | |
| 2013/0050228 A1 | 2/2013 | Petersen et al. | |

FOREIGN PATENT DOCUMENTS

| | | |
|---|---|---|
| EP | 1686621 A1 | 8/2006 |
| EP | 2437295 A2 | 4/2012 |

\* cited by examiner

MODULE ARRANGEMENT FOR POWER SEMICONDUCTOR DEVICES

FIELD OF THE INVENTION

The invention relates to a module arrangement comprising at least one module with a power semiconductor device. In particular, the invention relates to a module arrangement for power semiconductor devices with the capability to provide a very safe and reliable protection for the semiconductor devices.

BACKGROUND OF THE INVENTION

A variety of power semiconductor modules are known and used in many different electronic devices. A requirement of these power electronic modules is to provide an acceptable reliability as well as security.

Regarding security and reliability, power electronic modules and power semiconductor devices comprised therefrom are known to be sensitive against environmental influences. Especially humidity and moisture are of relevance when thinking about negatively influencing and potentially damaging the power semiconductor devices, or power semiconductor modules, respectively. In order to prevent moisture and other contaminants from penetrating into the module and reaching the power semiconductor devices, for example, it is known to apply silicone gel to the substrates and power semiconductor devices.

Known from DE 10 2010 041 714 A1, for example, is a power semiconductor module and a method for producing the same. Such a power semiconductor module comprises an interconnect device and a base plate. The base plate comprises a volume which is hermetically sealed and which is arranged for receiving a cooling fluid. Further, a housing is provided which housing is hermetically connected to the base plate.

Further, known from EP 1 686 621 A1 is a surface mountable hermetically sealed package. Such a package comprises a semiconductor device which is hermetically sealed in a housing portion thereof.

However, the protection of the semiconductor devices and thus the reliability of power semiconductor devices provided in modules, or module arrangements, respectively, and electrical devices being equipped therewith still have potential for improvements.

U.S. Pat. No. 6,650,559 B1 discloses in FIG. 3 and FIG. 7 module arrangement for power semiconductor devices with two power semiconductor modules, whereby the modules comprise an inner volume for receiving the a power semiconductor device which volume is surrounded by a module enclosure.

Furthermore, also US 2009/0021916 A1 shows in FIG. 3 and FIG. 4 such a module arrangement for power semiconductor devices, whereby the modules comprise an inner volume for receiving the at least one power semiconductor device which volume is surrounded by a module enclosure.

EP 2 437 295 A2 discloses in FIG. 1 and FIG. 2 a well-known module arrangement for power semiconductor devices.

Moreover, EP 1 544 915 A2 discloses an electrical circuit module heatsink mounting arrangement, whereby FIG. 25 is a view showing, in cross section, a schematic configuration of a packaged construction an electric circuit module. This electric circuit module has a fixture includes a case fitting portion or a screw fitting portion, which serves for fixation of a resin or metal case to accommodate therein an electrical equipment constituted with the use of the electric circuit module.

US 2012/0098119 A1 shows in FIG. 4 and FIG. 5 again a module arrangement for power semiconductor devices, whereby the modules comprise an inner volume for receiving the at least one power semiconductor device which volume is surrounded by a module enclosure.

SUMMARY OF THE INVENTION

It is therefore an object of the present invention to provide an improved module arrangement which allows an especially secure protection of the semiconductor devices and thus a significantly improved reliability.

This object is achieved by a module arrangement for power semiconductor devices according to the invention.

The invention relates to a module arrangement for power semiconductor devices, comprising one or more power semiconductor modules, wherein the one or more power semiconductor modules comprise a substrate with a first surface and a second surface being arranged opposite to the first surface, wherein the substrate is at least partially electrically insulating, wherein a conductive structure is arranged at the first surface of the substrate, wherein at least one power semiconductor device is arranged on said conductive structure and electrically connected thereto, wherein the one or more modules comprise an inner volume for receiving the at least one power semiconductor device which volume is hermetically sealed from its surrounding by a module enclosure, wherein the module arrangement comprises an arrangement enclosure at least partly defining a volume for receiving the one or more modules, and wherein the enclosure covers said volume.

According to the invention, a module arrangement may be provided which allows an improved protection of semiconductor devices, or chips, respectively, from environmental influences like humidity and moisture whilst maintaining their partial discharge performance which is especially advantageous for high voltage applications, or high power applications, respectively. Such power applications generally may exemplarily and non-limiting be those applications which deal with currents or more than 75 A and/or voltages of more than 1000V.

In detail, the module arrangement for power semiconductor devices comprises one or more power semiconductor modules. According to the invention it may thus be provided that the power module arrangement comprises only one power semiconductor module, or it may comprise more than one power semiconductor module. In a non-limiting example, two or more, for example 2 to 6 power semiconductor modules may be provided in a power semiconductor module arrangement. Further, the following features described may be provided for one or a defined number of the present power semiconductor modules, wherein further semiconductor modules not having the described properties or being arranged differently may be present and comprised by the power semiconductor arrangement without leaving the scope of the present invention.

With regard to the one or more power semiconductor modules, these may comprise a substrate with a first surface and a second surface being arranged opposite to the first surface. The substrate is at least partially electrically insulating, which particularly means that areas, or regions, respectively, of this substrate may be electrically insulating whereas further areas or regions, respectively, may not be electrically insulating but electrically conductive. Alternatively, the substrate may for example be completely electrically insulating in case it is formed from an electrically insulating material.

Generally one skilled in the art is aware of the requirements for power semiconductor modules and substrates provided therefore because of which it is known for one skilled in the art which kind of materials are suitable as electrically conductive materials and electrically insulating materials, respectively. As examples and in a non-limiting way insulating materials may comprise materials which comprise Aluminium Nitride (AlN) with a resistivity of $10^{10}$ ohm·m, whereas electrically conducting materials may in an exemplary and non-limiting way comprise materials such as copper (Cu) with a resistivity of $0.1695 \times 10^{-7}$ ohm·m.

Further, a conductive structure such as particularly a conductive path, such as particularly a metallization is arranged at the first surface of the substrate. This may exemplarily mean that the conductive structure is formed on the surface of the substrate. This arrangement may for example be advantageous in case the substrate is fully electrically insulating and the conductive structure may thus be formed by depositing it, for example as a structured metallisation, on the surface of the electrically insulating material of the substrate. Alternatively, the substrate as such may be formed in part electrically insulating and in part electrically conductive. Therefore, the electrically conductive areas, or positions, respectively, may as such form the first surface of the substrate, or at least a part thereof and particularly the electrically conductive structure.

The conductive structure may essentially be provided at the first surface of the substrate in order to receive one or more power semiconductor devices as will be described down below.

In detail, at least one power semiconductor device is arranged on the above-described conductive structure and is electrically connected thereto, as it is basically known from known power semiconductor modules. The semiconductor devices may generally be provided as known in the art for power semiconductor modules, or power semiconductor arrangements, respectively. For example, the one or more power semiconductor device may be an insulated gate bipolar transistor (IGBT), a reverse conductive insulated gate bipolar transistor (reverse conducting IGBT), bi-mode insulated gate transistor (BIGT) and/or a diode, such as a Shottky diode. Further and in order to let the power semiconductor module and thus the power semiconductor arrangement work properly, more than one of different or the same semiconductor device may be present. As a non-limiting example, an IGBT and a diode may be present in one module. The power semiconductor device may further be connected to the substrate by means of an adhesive having an appropriate electrical conductivity. For example, the semiconductor device may be fixed to the substrate, or its electrically conductive structure, respectively, by means of a solder. In particular, the first main contact of the semiconductor device, such as the collector of an IGBT for example, may be fixed to the substrate, whereas the second main contact of the semiconductor device, such as the emitter of an IGBT, may be connected to a further location of the substrate and in particular to a further part of the electrically conductive structure, or a further conductive path, for example by means of a bond wire.

Further, according to the invention, the one or more module comprises an inner volume for receiving the at least one power semiconductor device which volume is hermetically sealed from its surrounding by a module enclosure. According to this, the interior of the module, such as particularly the power semiconductor devices and the respective first surface of the substrate or the whole substrate, are hermetically sealed and thus effectively separated from the surrounding of the module.

A hermetically sealing may thereby particularly mean a sealing, or an encapsulation, respectively, which does not allow liquid or gaseous substances to be introduced in or to leave the respective hermetically sealed volume especially at standard working conditions such as ambient pressure and temperatures arising at a standard performance.

Furthermore, the module arrangement comprises an arrangement enclosure at least partly defining a volume for receiving the one or more modules, and the enclosure covers said volume. In other words, the one or more module enclosures, which hermetically seal the interior of the modules are as such received from a volume which is part of the module arrangement and which in turn is covered by an arrangement enclosure and thus separated from the surrounding of the arrangement. This arrangement provides for a significantly improved security and reliability behaviour of the power semiconductor module as well as power semiconductor arrangement.

In detail, already by providing a hermetical sealing of the one or more power semiconductor modules, the modules as such and the power semiconductor devices arranged therein may significantly be secured from negatively influencing them by undesired components to be inserted. For example, the penetration of humidity, or moisture, respectively, into the module may significantly be hindered. This allows protecting the power semiconductor modules and the power semiconductor devices, respectively, from corrosive environments which in turn largely enhances the long term stability of the latter and thus their reliability as well as the reliability of the electric devices equipped therewith.

Further, by providing an additional protection of the modules as building blocks for the module arrangement, by providing an arrangement enclosure at least partly defining a volume for receiving the one or more modules, and the enclosure covers said volume, the security as well as the reliability may additionally be enhanced. This is due to the fact that a first protection is provided by the arrangement enclosure. Even in case this enclosure not hermetically seals the interior volume of the latter, a first degree of protection may already be given. As a result the negative influences acting on the module enclosures may significantly be reduced to a minimum. Further, the modules as such provide a further superb protection so that the danger of the semiconductor devices being damaged is further significantly be reduced. In other words, the module enclosure may act as inner enclosure and the arrangement enclosure may act as outer enclosure which may double the protection.

The requirements for the arrangement enclosure may thus be limited. The arrangement enclosure, or outer enclosure, respectively, may simply be formed from plastics so that this enclosure is especially easy and cost-saving to form thereby anyway providing a superb security.

Further, even in case a module gets damaged, the influence on further provided modules may significantly be reduced due to the fact that the further provided modules are securely protected by the hermetically sealing enclosure.

Apart from that, a high current capability, a good thermal conductivity and a good isolation capability of the modules may be achieved. This allows that the performance of the modules or the module arrangement is not negatively influenced. Thus, the performance is well applicable for the required and known applications. Exemplary and non-limiting applications comprise traction applications, industrial drives, as well as transmission and distribution.

The production process may further be simplified due to the fact that the modules are fully protected and can be electrically tested to their full performance. This also simplifies the design and the assembly of the full module arrangement. This is especially true for applications in the range of equal or less than 3.3 kV.

As a result, the module arrangement according to the invention provides an especially improved reliability allowing an improved long-time stability of the arrangement as such as well as of the electric devices being equipped therewith. Apart from that, the performance is not negatively influenced.

According to an embodiment, each inner volume of the one or more modules is hermetically sealed from its surrounding by a module enclosure. According to this embodiment, not only single defined power modules are hermetically sealed but all modules present are likewise protected. This embodiment thus allows an especially high degree of protection due to the fact that all modules are protected from undesired influences and further all modules are protected from influences based on different modules. Therefore, the reliability according to this embodiment is particularly high.

According to a further embodiment, the substrate of at least one module comprises electrical insulating areas and electrical conducting areas, the electrical insulating areas and the electrical conducting areas being arranged for externally contacting at least one semiconductor device being comprised by a module through the substrate, or through its electrical conductive areas, respectively. For example, according to this embodiment the substrate may be based on an arrangement comprising copper-bonded silicon nitride packing technology. This embodiment allows providing electrical contacts to the outside of the modules without providing through holes in the module enclosure. Therefore the hermetic sealing may withstand especially harsh conditions even for especially long time scales. Therefore, the reliability according to this embodiment is especially high. Further, the enclosure may be formed especially easy and further especially time saving. The amount of the electric conductivity as well as of the electric resistivity may thereby be adapted to the special use. In fact, the materials have to be selected such that the current may be guided in an appropriate manner allowing the module to work properly, whereas the insulating structures should avoid carrying any current under working conditions of the module. In fact, the insulating structure may for example be a ceramic material and/or the conductive structure may be a metal.

According to this embodiment, it is especially preferred that the electrical conducting areas connect at least one power semiconductor device to a connection area located outside the module enclosure by means of a via. Such an embodiment provides an especially preferred and well defined and adaptable external contact of the active devices inside the module, i.e. the power semiconductor devices due to the fact that the contact may be solely provided via the substrate. Therefore, damages or leakages of the module enclosure may further be reduced according to which the reliability as well as the durability of a module according to this embodiment is especially improved.

According to a further embodiment, electrical conductors for contacting the interior of the one or more modules are guided through the module enclosure by means of hermetic sealings. This allows using a conventional substrate making the use of this substrate especially easy and cost-saving. With respect to the hermetic sealings, two exemplary embodiments may be provided even if this embodiment is not limited to the subsequent alternatives. As a first example, the contacts may be guided through the enclosure and may be sealed by means of a glass seal. According to a second example, the contacts may be sealed by means of a ceramic seal. An advantage of a ceramic seal is the possibility to provide a coefficient which very well matches the one of the adjacent materials, such as the material of the enclosure and the electrical conductor. An advantage of the glass seal may be particularly its low costs.

According to a further embodiment, the module enclosure and/or the arrangement enclosure comprises at least one material selected from the group consisting of AlSiC and metals.

With regard to AlSiC, this material comprises a matrix comprising aluminium in which matrix silicon carbide particles are arranged. With this regard, a weight reduction may be achieved of up to 40% to 70% with regard to standard materials leading to a significant advantage especially for mobile applications, such as applications in trains. Further, the coefficient of thermal expansion (CTE) may match very well with the ones of adjacent components, which reduces the danger of cracks especially due to temperature variations and which further improves the reliability of the power arrangement, or the electric devices equipped therewith. Apart from that, the thermal conductivity of such material is comparatively high so that heat generated may easily be dissipated so that the heat influence may further be reduced. This additionally improves the reliability.

The specific AlSiC material used is not limited. For example, the following materials may be used. For example, AlSiC-9, AlSiC-10 or AlSiC-12 may be used, all having respective coefficients of thermal expansion lying in the range of approximately 170 to 200 W/m K which may be especially advantageous for power semiconductor devices.

With regard to the metal material, several metals may be used. For example, nickel-cobalt ferrous alloys may be advantageous under which the one which is purchasable under its name Kovar may especially be preferred. With this regard, Kovar may have a typical composition of approximately 54 wt. % iron, 29 wt. % nickel, 17 wt. % cobalt. However, the composition may deviate from the above composition in that small amounts of carbon, silicon and manganese may be present, the latter being present in an amount of less than 1 wt. %, particularly less than 0.5 wt. %. The above named alloys further may have advantageous coefficients of thermal expansion being close to these of adjacent components leading to an especially high reliability.

According to a further embodiment the inner volume of the one or more modules is filled with a compound selected from the group consisting of silicon gel and an inert gas.

The advantage of silicon gels thereby may be seen in the unique combination of electrical and mechanical properties, namely its softness, deformability and tackiness along with superb isolation capability.

The advantages of inert gas may particularly lie in an easy method for producing the modules as well as the whole arrangement, for example, due to easy handling and processing of the inert gas. Further, especially by using inert gas for filling the interior of the power semiconductor modules, the operation temperature is not limited but may be chosen without any restrictions with regard to the respective application and the capability of the semiconductor component irrespective of the package. A negative influence to the temperature stable inert gas is not to be expected. Further, it is comparably trivial to provide the modules with a slight overpressure allowing impending that undesired substances are introduced into the module. Apart from that, by using an inert gas as filling material for the interior of the module, there is no danger of undesired components to flow out of the module and deteriorating the further components surrounding the latter. Examples for respective inert gases comprise in a non-limiting list argon and nitrogen. To summarize, the above defined embodiments highly contribute particularly for improving the security as well as the reliability of the arrangement according to the invention and to an electrical device equipped therewith.

Further, by using an appropriate inert gas or silicon gel, the partial discharge capability can also be minimized further improving the reliability.

According to a further embodiment, a single substrate is arranged for accommodating two or more modules, the two or more modules each being arranged inside the volume defined by the arrangement enclosure. Advantages of this embodiment comprise improved scalability as well as modularity.

According to a further embodiment, the arrangement enclosure hermetically seals the volume defined therefrom. For example, the arrangement enclosure may be connected to a base plate being arranged at the second surface of the substrate. According to this embodiment, the reliability is especially high due to the fact that the outer enclosure, or the enclosure of the arrangement, respectively, as well provides a hermetic seal. Therefore, undesired substances such as particularly humidity, or moisture, respectively, will not be introduced into the volume of the power module arrangement and will thus not even come in contact with the module. Therefore, the reliability will be especially high due to a doubled hermetical sealing of the power semiconductor devices with respect to the outer atmosphere.

According to a further embodiment, the volume at least partly defined by the arrangement enclosure is filled with a compound selected from the group consisting of silicon gel and an inert gas. According to this embodiment, the explicit gases as well as the advantages as described above with respect to the filling of the modules may be provided. Further, the filling of this volume defined by the arrangement enclosure may be the same or different compared to the volume inside the module. This embodiment may allow an improved adaption of the respective properties to the desired application.

With respect to further technical features and advantages of the described power module arrangement it is referred to the description of the electrical device as well as to the figures.

The present invention further refers to an electrical device, comprising a module arrangement that has the particular advantage of a significantly improved working behaviour and further of a significantly improved reliability.

Non-limiting examples for such electronic devices comprise devices for Industrial drives and traction with high reliability, high reliability applications for harsh conditions, such as subsea, space, military applications and for the automotive industry.

BRIEF DESCRIPTION OF THE DRAWINGS

Additional features, characteristics and advantages of the subject-matter of the invention are depicted in the figures and the following description, which—in an exemplary fashion—show embodiments and examples of a semiconductor module arrangement according to the invention.

DETAILED DESCRIPTION OF THE INVENTION

Figure 1:
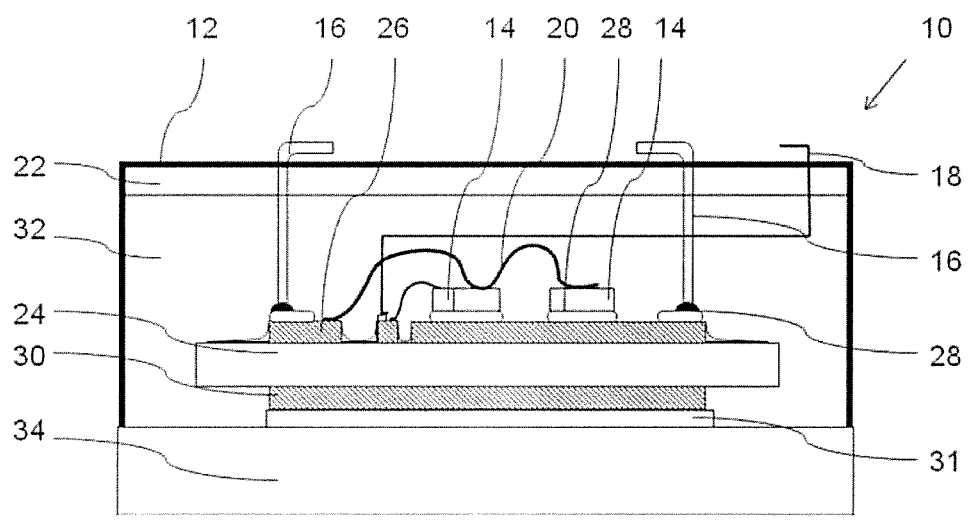
FIG. 1 shows a sectional side view of an embodiment of a module according to the prior art.

In FIG. 1, an arrangement of a power semiconductor module 10 according to the prior art is schematically shown. In detail, the internal structure of said power module 10 is described. The power module 10 comprises a housing 12 in which at least one power semiconductor device 14 is arranged. The semiconductor device 14 may in an exemplary manner be an insulated gate bipolar transistor (IGBT), a diode, a metal oxide semiconductor field-effect transistor (MOSFET), or the like. According to FIG. 1, a diode and an IGBT are provided. The semiconductor device 14 or the plurality of semiconductor devices 14 are connectable via terminals 16 and via a gate connection 18, wherein the semiconductor device 14 is preferably bonded by aluminium bond wires 20.

As an insulator, a layer of epoxy 22 may be arranged above the semiconductor device 14. The semiconductor device 14 may further be arranged on a substrate 24. The semiconductor device 14, the terminals 16 as well as the gate connection 18 are connected to the substrate 24 via a metallization 26, in particular a copper metallization, and a solder 28, or lot, respectively. However, comparable connections, such as ultrasonic welding, may be applied. Additionally, the substrate 24 is connected to a further metallization 30, in particular a copper metallization, at its bottom side. The remaining volume inside the housing 12 is filled with an insulating gel 32.

Further, the power module 10 comprises a base plate 34. The base plate 34 is in thermal contact to the semiconductor device 14 on its upper side via the metallization 30 and a solder 31.

Figure 2:
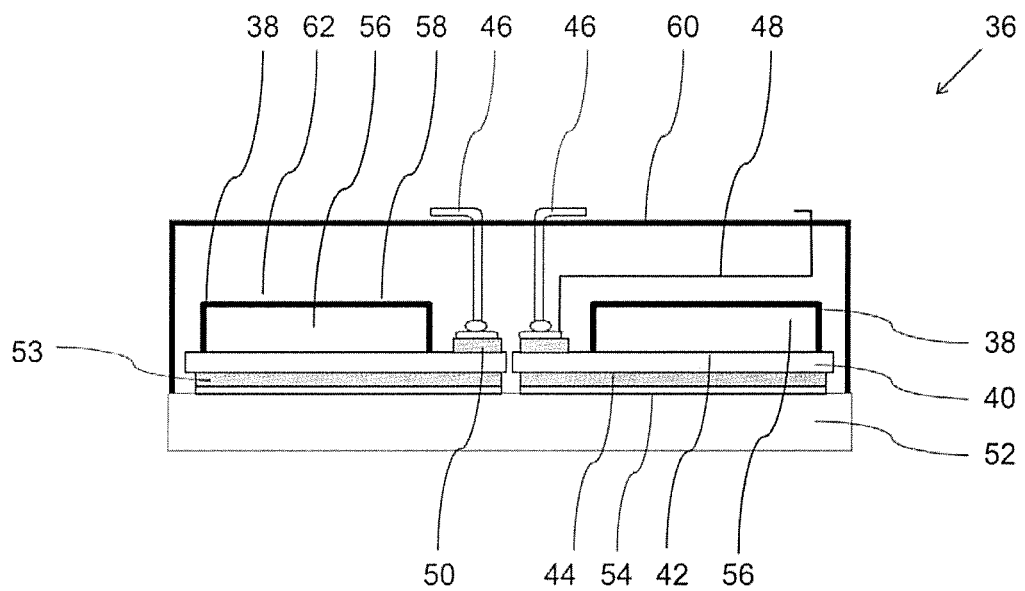
FIG. 2 shows a sectional side view of an embodiment of a module arrangement according to an embodiment of the invention.

In FIG. 2, a module arrangement 36 according to the invention is shown. The arrangement 36 according to FIG. 2 comprises in a non-limiting example two power semiconductor modules 38 which are shown only schematically and will be described in more detail with respect to FIGS. 3 and 4 down below. The power semiconductor modules 38 are located on a substrate 40 with a first surface 42 and a second surface 44 being arranged opposite to the first surface 42, wherein the substrate 40 is at least partially electrically insulating. For example, the substrate 42 may be formed of a ceramic insulator, in particular of an aluminium nitride ceramic insulator. Further, a conductive structure is arranged at the first surface 42 of the substrate 40, wherein at least one power semiconductor device is arranged on said conductive structure and electrically connected thereto. The electrically conductive structure is not shown in detail in FIG. 1.

Further, the modules 38 may be connected by terminals 46 as well as the gate connection 48, which connections may be connected to the substrate 40, or the conductive structure thereof, via a conducting material, such as a solder 50, or they may be welded thereto, for example.

The substrate 40 is further connected with its second surface 44 to a base plate 52 via a metallization 53 and a solder 54.

According to the invention, at least one, preferably all of the present modules 38 comprise an inner volume 56 for receiving the at least one power semiconductor device, which volume 56 is hermetically sealed from its surrounding by a module enclosure 58. Apart from that, the module arrangement 36 comprises an arrangement enclosure 60, for example made from plastics, at least partly defining a volume 62 for receiving the one or more modules 38, and wherein the arrangement enclosure 60 covers said volume 62.

The module enclosure 58 as well as the arrangement enclosure 60 may thereby comprise at least one material selected from the group consisting of AlSiC and a metal. Alternatively or additionally, the inner volume 56 of the one or more modules 38 and/or the volume 62 at least partly defined by the arrangement enclosure 62 is filled with a compound selected from the group consisting of silicon gel and an inert gas.

Preferably, the arrangement enclosure 60 hermetically seals the volume 62 defined therefrom. For such a hermetical seal, sealings are foreseen whereby in FIG. 1 the sealings are generally not shown for clarity reasons. The sealings can be formed and realized as mentioned and disclosed in this specification and in FIGS. 2 and 3.

Figure 3:
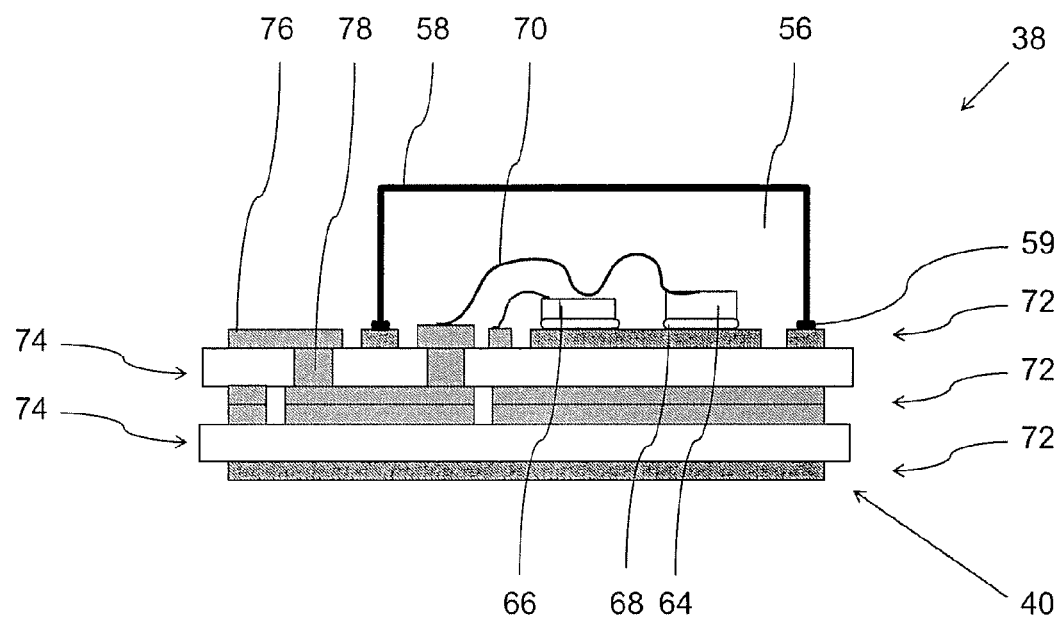
FIG. 3 shows an embodiment of a module for a module arrangement according to the invention.

In FIG. 3, an embodiment of a module 38 for an arrangement 36 is shown in detail. According to FIG. 3, the module 38 comprises the module enclosure 58 which defines the volume 56. Like stated above, this volume 56 may be filled with an inert gas or with silicon gel, for example. Further arranged in the volume 56 are two power semiconductor devices, i.e. a diode 64 and an IGBT 66. The semiconductor devices are further connected to the substrate 40, or electrically conducting regions thereof, for example by means of a solder 68, and further bonded by bond wires 70 to the substrate 40, or the electrically conducting structure thereof. Furthermore, a sealing 59, such as a metal pattern for sealing the enclosure 58 to the substrate is provided.

With respect to the substrate 40, the latter comprises electrical insulating areas and electrical conducting areas, the electrical insulating areas and the electrical conducting areas being arranged for externally contacting at least one semiconductor device being comprised by the module 36 through the substrate 40. In detail, the substrate 40 is formed in a multilayer structure comprising structured conductive layers 72, for example copper layers, forming the electrical conducting regions and insulating layers 74 comprising an insulating material, such as a ceramic material, for example, forming the electrically insulating regions. The structure of the conductive layers 72 and insulating layers 74 and thus the arrangement of the conductive and insulating regions are thus arranged such, that respective conductors are formed for externally contacting the module 38, for example by means of an connection area 76 located outside the enclosure 58. Therefore, electrically conductive areas, such as a via 78, may as well be provided in the insulating layers 74 for providing a desired conductive path, and vice versa, for generating the desired structure of the layers 72, 74. Such an arrangement may be based on the copper bonded silicon nitride technology.

The above structure of the substrate 40 may for example be achieved by copper-bonding two ceramic layers to each other. The upper ceramic layer may thereby provide the circuit pattern to attach the power semiconductor devices mechanically by solder and electrically through wire bonds.

Figure 4:
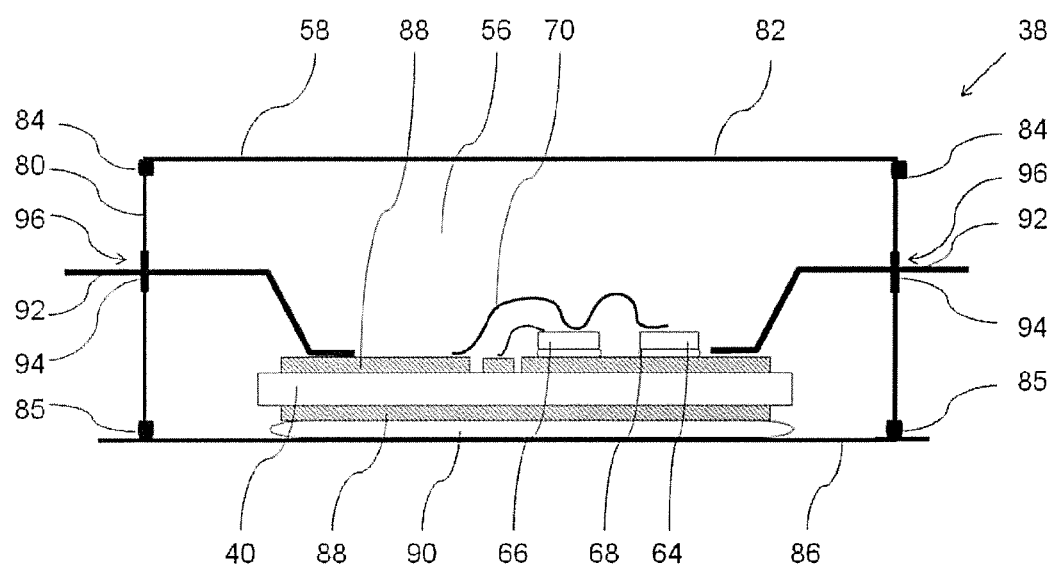
FIG. 4 shows a further embodiment of a module for a module arrangement according to the invention.

In FIG. 4, a further embodiment of the module 38 for a module arrangement 36 according to the invention is shown.

According to FIG. 4, the module 38 comprises the module enclosure 58. The module enclosure 58 may according to this embodiment but as well generally be formed in one piece, or it may be formed from wall pieces 80, or a frame, respectively, and a lid 82 which may be connected advantageously in a hermetic manner by sealings 84. Further sealings 85 may be provided for connecting the wall pieces 80 to a baseplate 86, the latter for example being formed from a metal. The sealings 84, 85 may correspond to the sealing 59 described with respect to FIG. 3. The module enclosure 58 further defines the volume 56. Like stated above, this volume 56 may be filled with an inert gas or with silicon gel, for example. Further arranged in the volume 56 are two power semiconductor devices, i.e. a diode 64 and an IGBT 66. The semiconductor devices are further connected to the substrate 40, or electrically conducting regions thereof, such as the metallization 88, for example by means of a solder 68, and further bonded by bond wires 70 to the substrate 40, or the electrically conducting structure thereof. Furthermore, metallization 88 like copper layers may be provided above and beneath the substrate 40. The lower metallization 88 may be connected to the baseplate by means of a solder 90.

Further, in order to electrically connect the inner components of the module 38, electrical conductors 92 are provided being connected to the upper metallization 88, for example, and being guided through the module enclosure 58 by means of hermetic sealings 94. These sealings 94 may for example be formed from glass or from a ceramic material.

In order to produce such an embodiment, in a first step the substrate 40 with soldered and wire bonded power semiconductor devices may be soldered to the metal baseplate. Afterwards, the metal frame with the conductor feedthroughs 96 may be soldered or brazed to the baseplate. The feedthroughs 96 may then be connected to the substrate metallisation using US welding. Finally, the enclosure 58 may be soldered or brazed to the frame in order to seal the package.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed:

1. A module arrangement for power semiconductor devices, comprising:
   one or more power semiconductor modules, wherein the one or more power semiconductor modules each includes a substrate with a first surface and a second surface being arranged opposite to the first surface,
   wherein for each of the one or more modules, the substrate is at least partially electrically insulating, a conductive structure is arranged at the first surface of the substrate, and at least one power semiconductor device is arranged on said conductive structure and electrically connected thereto, wherein the one or more modules each comprises an inner volume for receiving the at least one power semiconductor device, the inner volume of at least one of the one or more modules being hermetically sealed from its surrounding by a module enclosure, wherein the module arrangement comprises an arrangement enclosure at least partly defining a volume for receiving the one or more modules, wherein the arrangement enclosure covers said volume, and wherein the arrangement enclosure hermetically seals the volume defined therefrom.

2. The module arrangement according to claim 1, wherein each inner volume of the one or more modules is hermetically sealed from its surrounding by the respective module enclosure.

3. The module arrangement according to claim 1, wherein the substrate of at least one module of said one or more modules comprises multiple electrical insulating layers and multiple electrical conducting layers, the electrical insulating layers and the electrical conducting layers being arranged for externally contacting said at least one power semiconductor device being comprised by said at least one module through the substrate.

4. The module arrangement according to claim 3, wherein the electrical conducting layers connect said at least one power semiconductor device to a connection area located outside the module enclosure by a via.

5. The module arrangement according to claim 1, wherein electrical conductors for contacting an interior of the one or more modules are guided through the module enclosure by hermetic sealings.

6. The module arrangement according to claim 1, wherein the module enclosure and/or the arrangement enclosure comprises at least one material selected from the group consisting of AlSiC and metals.

7. The module arrangement according to claim 1, wherein the inner volume of at least one of the one or more modules is filled with a compound selected from the group consisting of silicon gel and an inert gas.

8. The module arrangement according to claim 1, wherein the volume at least partly defined by the arrangement enclosure is filled with a compound selected from the group consisting of silicon gel and an inert gas.

9. An electrical device, comprising:
a module arrangement including one or more power semiconductor modules, wherein the one or more power semiconductor modules each includes a substrate with a first surface and a second surface being arranged opposite to the first surface,
wherein, for each of the one or more modules, the substrate is at least partially electrically insulating, a conductive structure is arranged at the first surface of the substrate, and at least one power semiconductor device is arranged on said conductive structure and electrically connected thereto,
wherein the one or more modules each comprises an inner volume for receiving the at least one power semiconductor device, the inner volume being hermetically sealed from its surrounding by a module enclosure,
wherein the module arrangement comprises an arrangement enclosure at least partly defining a volume for receiving the one or more modules, wherein the arrangement enclosure covers said volume, and
wherein the arrangement enclosure hermetically seals the volume defined therefrom.

10. The module arrangement according to claim 1, wherein the at least one power semiconductor device comprises one of an insulated gate bipolar transistor, diode, or metal oxide semiconductor filed-effect transistor.

11. The module arrangement according to claim 1, further comprising a base plate, wherein the arrangement enclosure and the base plate define the volume for receiving the one or more modules.

12. The module arrangement according to claim 11, wherein the second surface of the substrate of each of the one or more modules is connected to the base plate.

13. The module arrangement according to claim 12, wherein the second surface of the substrate of each of the one or more modules is connected to the base plate through a metallization and a solder.

14. The module arrangement according to claim 1, wherein for each of the one or more modules, the at least one power semiconductor device is connected to the conductive structure by a solder and further bonded by wires to the conductive structure.

15. The module arrangement according to claim 1, wherein for at least one of the one or more modules, the module enclosure is formed as one single piece.

16. The module arrangement according to claim 1, wherein for at least one of the one or more modules, the module enclosure is formed as a frame of wall pieces and a lid connected to the wall pieces by hermetic sealings.

17. A module arrangement for power semiconductor devices, comprising:
a plurality of power semiconductor modules, each of the plurality of modules includes a substrate with a first surface and a second surface being arranged opposite to the first surface,
a base plate, the second surface of the substrate of each of the plurality of modules is connected to the base plate, and
an arrangement enclosure connected to the base plate, the arrangement enclosure and base plate define a volume for receiving the plurality of modules, the arrangement enclosure hermetically sealing the volume defined by the arrangement enclosure and the base plate,
wherein for each of the plurality of modules, the substrate is at least partially electrically insulating, a conductive structure is arranged at the first surface of the substrate, and at least one power semiconductor device is arranged on said conductive structure and electrically connected thereto,
wherein the plurality of modules each comprises an inner volume for receiving the at least one power semiconductor device, the inner volume being hermetically sealed from its surrounding by a module enclosure.

* * * * *